United States Patent
Yao et al.

(10) Patent No.: US 10,414,916 B2
(45) Date of Patent: Sep. 17, 2019

(54) RESIN COMPOSITION, ARTICLE OF MANUFACTURE MADE THEREFROM AND METHOD OF MAKING THE SAME

(71) Applicant: Elite Electronic Material (KunShan) Co., Ltd., Kunshan, Jiangsu Province (CN)

(72) Inventors: Xingxing Yao, Kunshan (CN); Rongtao Wang, Kunshan (CN); Chuanfei Xu, Kunshan (CN)

(73) Assignee: ELITE ELECTRONIC MATERIAL (KUNSHAN) CO., LTD., Kunshan, Jiangsu Province (CN)

(*) Notice: Subject to any disclaimer, the term of this patent is extended or adjusted under 35 U.S.C. 154(b) by 73 days.

(21) Appl. No.: 15/434,794

(22) Filed: Feb. 16, 2017

(65) Prior Publication Data
US 2018/0086911 A1  Mar. 29, 2018

(30) Foreign Application Priority Data
Sep. 23, 2016  (CN) .......................... 2016 1 0846058

(51) Int. Cl.
| | | |
|---|---|---|
| C08L 63/00 | (2006.01) | |
| C08J 5/24 | (2006.01) | |
| H05K 1/03 | (2006.01) | |
| C08G 59/50 | (2006.01) | |
| C08L 63/04 | (2006.01) | |
| C08L 63/08 | (2006.01) | |
| H05K 1/02 | (2006.01) | |
| H05K 3/46 | (2006.01) | |

(52) U.S. Cl.
CPC ............ *C08L 63/00* (2013.01); *C08G 59/504* (2013.01); *C08J 5/24* (2013.01); *H05K 1/0353* (2013.01); *H05K 1/0373* (2013.01); *C08J 2363/00* (2013.01); *C08J 2363/04* (2013.01); *C08J 2363/08* (2013.01); *C08J 2479/04* (2013.01); *C08L 63/04* (2013.01); *C08L 63/08* (2013.01); *C08L 2201/02* (2013.01); *C08L 2203/20* (2013.01); *H05K 1/024* (2013.01); *H05K 3/4655* (2013.01); *H05K 2201/012* (2013.01); *H05K 2201/0209* (2013.01)

(58) Field of Classification Search
CPC ....... C08L 63/00; C08L 65/02; C08K 5/5313; C08K 5/5397
See application file for complete search history.

(56) References Cited

U.S. PATENT DOCUMENTS

| | | | | |
|---|---|---|---|---|
| 2012/0055705 A1* | 3/2012 | White | ............... | C07F 9/657172 |
| | | | | 174/259 |
| 2016/0222204 A1* | 8/2016 | Wang | ................... | B32B 15/092 |

FOREIGN PATENT DOCUMENTS

| | | | | |
|---|---|---|---|---|
| WO | WO-2015024256 A1 * | 2/2015 | ........... | B32B 15/092 |

OTHER PUBLICATIONS

Melamine cyanurate data sheet (2017) (Year: 2017).*
Chang Chun Plastics Co., Ltd., Epoxy Resin Catalog, 2014, 8 pages.

* cited by examiner

*Primary Examiner* — Robert C Boyle
(74) *Attorney, Agent, or Firm* — Muncy, Geissler, Olds & Lowe, P.C.

(57) ABSTRACT

Disclosed is a resin composition, comprising the following components: (A) 100 parts by weight of an epoxy resin; (B) 10 to 60 parts by weight of a diamino diphenyl ether type benzoxazine resin having a softening point of 40° C. to 140° C.; (C) 10 to 40 parts by weight of a co-hardener; and (D) 10 to 40 parts by weight of a flame retardant which comprises (d1) a high melting point flame retardant with a melting point of greater than 260° C. or (d2) a metal phosphinate flame retardant, wherein the metal is selected from Group IIIA elements. Also disclosed is an article of manufacture obtained from the resin composition and a use thereof. Accordingly, the demands of high frequency application can be met, and a balance of low thermal expansion, high thermal resistance and low warpage in the system can be struck.

9 Claims, No Drawings

RESIN COMPOSITION, ARTICLE OF MANUFACTURE MADE THEREFROM AND METHOD OF MAKING THE SAME

CROSS-REFERENCE TO RELATED APPLICATION

This application claims the priority benefits of China Patent Application No. 201610846058.7, filed on Sep. 23, 2016, the entirety of which is hereby incorporated by reference herein and made as a part of this specification.

FIELD OF DISCLOSURE

This disclosure relates to a base material for circuit boards and a method of making the same and more particularly to a high density interconnect (HDI) multilayer laminate and a method of making it.

BACKGROUND OF DISCLOSURE

In order to obtain a copper clad laminate with low dielectric properties, conventionally a benzoxazine resin and a styrene maleic anhydride were added into an epoxy resin to achieve a low dielectric loss, and an amine hardener is added thereto for improving peel strength, thereby using the technology approach to obtain a copper clad laminate with low dielectric properties.

The technology approach uses a low-cost epoxy resin. Epoxy resin is a resin with wide applicability, in which the ring-opening reaction of the epoxy group induces polymerization and crosslinking, and it has the advantages of absence of oxygen inhibition, high crosslinking, high conversion rate and high mechanical performance. However, epoxy resin inevitably causes volume shrinkage during the curing process and forms internal stress in the material which tends to cause warpage or crack and reduces the mechanical performance; the high volume shrinkage issue has become an urgent problem to be solved.

Recently, with the development of electronic technology, updating and new release of electronic products become faster, setting a higher challenge for the printed circuit industry and driving the development of future printed circuit technology toward multi-layer construction and high density interconnection. On the other hand, increase of layer number and trace density requires that a laminate as the base material of the circuit board to have lower thermal expansion, higher thermal resistance and smaller warpage, in the hope that it may, during the designing of the printed circuit, satisfy the impedance design and tolerate the thermal shock during the process.

In response to the demand of high density interconnection, the industry adopted high performance resin compositions including such as maleimide resin, benzoxazine resin and so on to fit this new technology approach. Maleimide resin is a high performance thermosetting resin having excellent thermal resistance, moist-heat resistance, dielectric properties and processability, and it is a common resin for modifying epoxy resin useful for making laminates. After ring opening, benzoxazine resin can form a structure similar to novolac resin, which effectively reduces water absorption rate of the cured system and increases chemical resistance, making it a popular resin for modifying epoxy resin for making laminates. However, the disadvantages are the unsatisfactory laminate properties, and there is still a need for lower thermal expansion, higher thermal resistance and smaller warpage; all these properties are specifically embodied in reflow shrinkage, storage modulus decrease rate, thermal resistance of high density holes, PCT thermal resistance after horizontal black oxide process and warpage height. Another drawback lies in the fact that the cost of maleimide is five folds of benzoxazine resin (Bz) and ten folds of epoxy resin; due to the limitations of process conditions, this situation is difficult to change.

Another approach is to use a third component, such as an allyl-modified bismaleimide, to improve the compatibility of epoxy resin and benzoxazine resin, so as to fit the needs of high density interconnect multilayer laminates. The disadvantage is that Tg and thermal resistance of the laminate is reduced.

Therefore, there is a need for developing a resin composition for high frequency applications and achieving the balance of thermal expansion, thermal resistance and low warpage in the system.

SUMMARY

A first object of this disclosure is to obtain a resin composition useful for making an article of manufacture for high frequency applications and achieving a balance of low thermal expansion, high thermal resistance and low warpage in the system.

A second object of this disclosure is to obtain an article of manufacture made from said resin composition for high frequency applications and achieve a balance of low thermal expansion, high thermal resistance and low warpage in the system.

A third object of this disclosure is to obtain a use of said resin composition for high density interconnect multilayer laminates.

A first aspect of the disclosure provides a resin composition comprising the following components:
(A) 100 parts by weight of an epoxy resin;
(B) 10 to 60 parts by weight of a diamino diphenyl ether type benzoxazine resin;
(C) 10 to 40 parts by weight of a co-hardener; and
(D) 10 to 40 parts by weight of a flame retardant which comprises the following flame retardant (d1), flame retardant (d2) or a combination thereof:
   (d1) a high melting point flame retardant with a melting point of greater than 260° C., or
   (d2) a metal phosphinate flame retardant, wherein the metal is selected from Group IIIA elements.

In one embodiment of the disclosure, the component (B) diamino diphenyl ether type benzoxazine resin has a softening point of 40° C. to 140° C.

Preferably, the diamino diphenyl ether type benzoxazine resin has a softening point of 60° C. to 120° C. More preferably, the softening point is between 69° C. and 85° C.

In one embodiment of this disclosure, the component (B) diamino diphenyl ether type benzoxazine resin is obtained by polymerization of the following monomer:

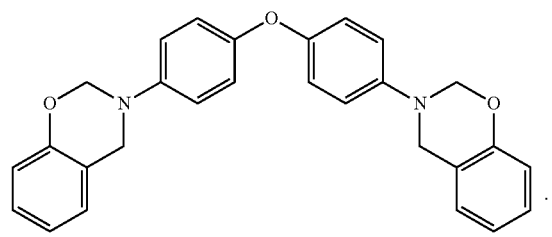 [SMILES: c1ccc2c(c1)CN(c1ccc(Oc3ccc(N4COc5ccccc5C4)cc3)cc1)CO2]

In one embodiment of this disclosure, the component (d1) high melting point flame retardant is selected from a phosphorus-containing flame retardant with a melting point of greater than 260° C. and having at least two DOPO structures, a phosphorus-containing flame retardant with a melting point of greater than 260° C. and having at least two DPPO structures and a combination thereof. Preferably, the component (d1) high melting point flame retardant is selected from a phosphorus-containing flame retardant with a melting point of greater than 260° C. and having two DOPO structures, a phosphorus-containing flame retardant with a melting point of greater than 260° C. and having two DPPO structures and a combination thereof.

The aforesaid DPPO structure refers to

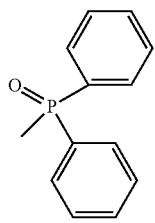

and the aforesaid DOPO structure refers to

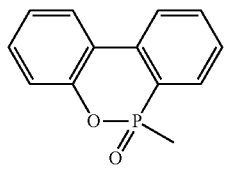

In one embodiment of this disclosure, the phosphorus-containing flame retardant with a melting point of greater than 260° C. and having two DOPO structures is selected from

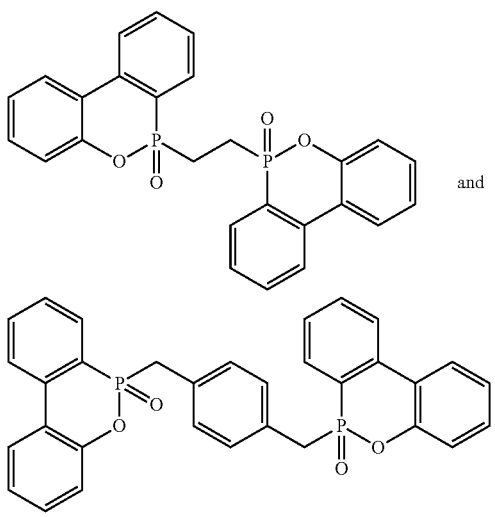

and

The phosphorus-containing flame retardant with a melting point of greater than 260° C. and having two DPPO structures is selected from:

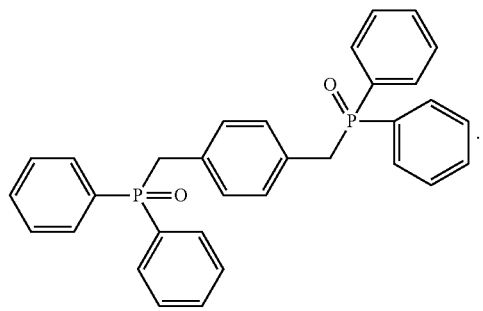 [SMILES: O=P(Cc1ccc(CP(=O)(c2ccccc2)c2ccccc2)cc1)(c1ccccc1)c1ccccc1]

In one embodiment of this disclosure, the component (d1) high melting point flame retardant has a melting point preferably between 265° C. and 350° C. and more preferably between 270° C. and 330° C.

In one embodiment of this disclosure, the component (d2) metal phosphinate flame retardant is aluminum phosphinate.

In one embodiment of this disclosure, the component (C) co-hardener comprises acid anhydride, cyanate ester, amine curing agent, phenol curing agent, maleimide, ester curing agent or a combination thereof.

A second aspect of the disclosure provides an article characterized by being a prepreg, a resin film, a copper clad laminate or a printed circuit board made from the resin composition of this disclosure.

A third aspect of the disclosure provides a use of the resin composition in preparing a high density interconnect multilayer laminate.

DETAILED DESCRIPTION OF EMBODIMENTS

The present disclosure employs a specific diamino diphenyl ether type benzoxazine resin in conjunction with a co-hardener and a high melting point flame retardant or a metal phosphinate without melting point to provide a laminate with excellent horizontal black oxide thermal resistance, high density hole thermal resistance, reduced warpage and reflow shrinkage, lower modulus decrease rate and increased storage modulus. In other words, this disclosure uses a diamino diphenyl ether type benzoxazine in conjunction with a co-hardener and a high melting point flame retardant, which surpasses the limits of conventional approaches and overcomes the technical difficulty of high density interconnect multilayer laminates currently not solved by new generation solutions (e.g. the approach using epoxy resin added with benzoxazine resin), thereby providing better performance.

As used herein, the terms "comprises," "comprising," "includes," "including," "has," and "having" indicate that various components may be used collectively in the mixture or composition of this invention. Therefore, the terms "consisting essentially of" and "consisting of" are encompassed by the terms "comprises," "comprising," "includes," "including," "has," and "having."

As used herein, the high melting point flame retardant is construed in contrast to the low melting point flame retardant; the low melting point flame retardant may be such as phosphazenes (e.g. SPB-100, with melting point of about 100° C. to 120° C., available from Otsuka Chemical Co. Ltd.), condensed phosphate ester (e.g. PX-200 with melting point of about 95° C. to 105° C. or PX-202 with melting point of about 170° C., available from Daihachi Chemical Industry Co. Ltd.).

Various aspects of this disclosure are described in detail below.

Resin Composition

A first aspect of this disclosure provides a resin composition, comprising:
(A) 100 parts by weight of an epoxy resin;
(B) 10 to 60 parts by weight of a diamino diphenyl ether type benzoxazine resin;
(C) 10 to 40 parts by weight of a co-hardener; and
(D) 10 to 40 parts by weight of a flame retardant which comprises the following flame retardant (d1), flame retardant (d2) or a combination thereof:
(d1) a high melting point flame retardant with a melting point of greater than 260° C., or
(d2) a metal phosphinate flame retardant, wherein the metal is selected from Group IIIA elements.

The component (B) diamino diphenyl ether type benzoxazine resin has a softening point of 40° C. to 140° C. Preferably, the diamino diphenyl ether type benzoxazine resin has a softening point of 60° C. to 120° C., and more preferably between 69° C. and 85° C.

The inventors found that the diamino diphenyl ether type benzoxazine resin, when being used in conjunction with other specific flame retardant(s), demonstrates excellent synergistic effect in the epoxy resin and co-hardener system and provides properties suitable for high density interconnect multilayer laminates.

The softening point is measured by routine method commonly used in this field.

Specifically, the measurement can be made as follows.
1. Apparatus and equipment
   1.1 automatic softening point test set: EX-820 Elex
   1.2 hot plate 20° C. to 200° C.
2. Reagents
   2.1 glycerin
   2.2 grease, such as silicone grease
3. Conditions
   3.1 test temperature of 70° C. (higher than the tested softening point)
4. Procedure
   4.1 weighing 2 gram of the sample on an aluminum foil;
   4.2 coating grease on slide glass thinly, placing the ring on it, and then putting it on the hot plate;
   4.3 adjusting the temperature of the hot plate at 70° C., greater than the expected softening point;
   4.4 placing the sample into the ring to melt it;
   4.5 after resin has been melted down, removing it from the hot plate and place into desiccator for 20 minutes at room temperature;
   4.6 filling the water bath with glycerin;
   4.7 fixing the sample ring and ball guide on the ring holder;
   4.8 placing a ball on the ball guide;
   4.9 turning on a magnetic stirrer;
   4.10 pressing the START button to measure the softening point, which is shown on display.

In one embodiment, the component (B) diamino diphenyl ether type benzoxazine resin may be any one of a monomer, an oligomer or a polymer and may comprise a monomer, an oligomer and/or a polymer. Polymerized resin shall meet the softening point requirement.

Preferably, it is obtained by polymerization of the following monomer:

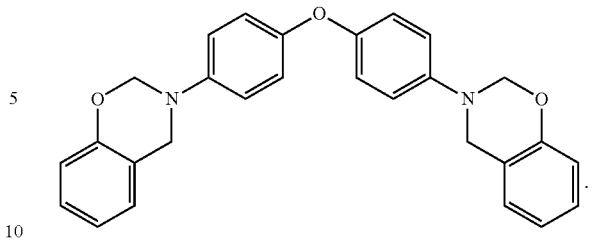

The polymerized resin may comprise a monomer, an oligomer and/or a polymer. Polymerized resin shall meet the softening point requirement.

The component (D) high melting point flame retardant and metal phosphinate flame retardant can be used separately or used together at any ratio without limitation. A preferred ratio is 1:10 to 10:1 and more preferably 1:5 to 5:1.

Preferably, the component (d1) high melting point flame retardant has a melting point between 265° C. and 350° C. and more preferably between 270° C. and 330° C.

In one embodiment, the high melting point flame retardant with a melting point of greater than 260° C. is preferably a phosphorus-containing flame retardant with a melting point of greater than 260° C. and having two DOPO structures or a phosphorus-containing flame retardant with a melting point of greater than 260° C. and having two DPPO structures.

The aforesaid DPPO structure refers to

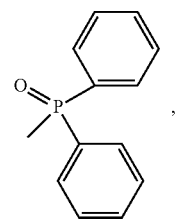

and the aforesaid DOPO structure refers to

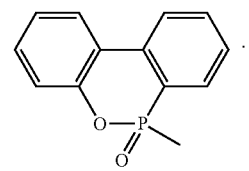 [SMILES: CP1(=O)Oc2ccccc2-c2ccccc21]

In one embodiment, the phosphorus-containing flame retardant with a melting point of greater than 260° C. and having two DOPO structures is as shown below but not limited thereto:

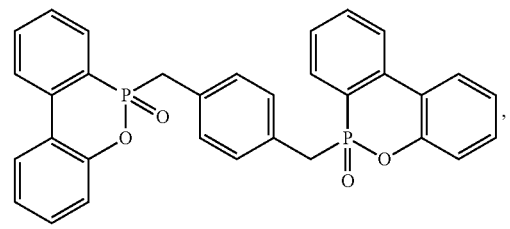

(melting point: 270° C. to 280° C.)

-continued

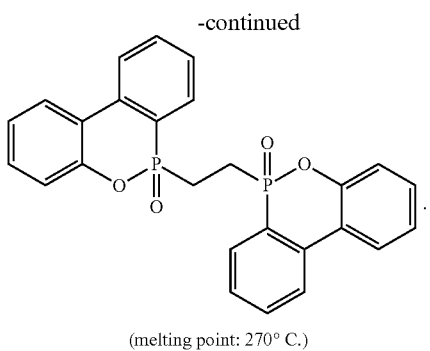

(melting point: 270° C.)

In one embodiment, the phosphorus-containing flame retardant with a melting point of greater than 260° C. and having two DPPO structures has a structure shown below:

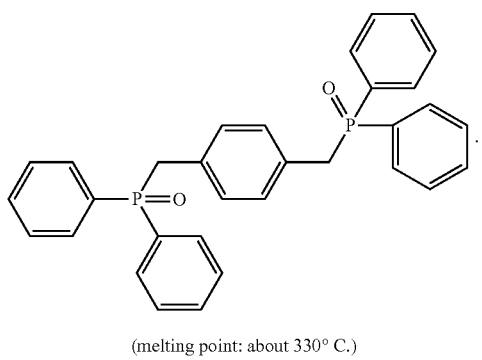 [SMILES: O=P(Cc1ccc(CP(=O)(c2ccccc2)c2ccccc2)cc1)(c1ccccc1)c1ccccc1]

(melting point: about 330° C.)

Preferably, the component (d2) metal phosphinate is aluminum phosphinate. The phosphinate group and aluminum ion of the aluminum phosphinate can be present in any forms, which are all encompassed in the present disclosure.

In one embodiment, the aluminum phosphinate preferably has the following structure but not limited thereto:

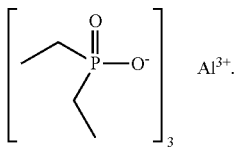

In one embodiment, the resin composition consists of the following components:
(A) 100 parts by weight of an epoxy resin;
(B) 10 to 60 parts by weight of a diamino diphenyl ether type benzoxazine resin;
(C) 10 to 40 parts by weight of a co-hardener; and
(D) 10 to 40 parts by weight of a flame retardant which comprises the following flame retardant (d1), flame retardant (d2) or a combination thereof:
(d1) a high melting point flame retardant with a melting point of greater than 260° C., or
(d2) a metal phosphinate flame retardant, wherein the metal is selected from Group IIIA elements.

In one embodiment, the resin composition consists of the following components:
(A) 100 parts by weight of an epoxy resin;
(B) 10 to 60 parts by weight of a diamino diphenyl ether type benzoxazine resin;
(C) 10 to 40 parts by weight of a co-hardener; and
(D) 10 to 40 parts by weight of a high melting point flame retardant with a melting point of greater than 260° C.

In one embodiment, the resin composition consists of the following components:
(A) 100 parts by weight of an epoxy resin;
(B) 10 to 60 parts by weight of a diamino diphenyl ether type benzoxazine resin;
(C) 10 to 40 parts by weight of a co-hardener; and
(D) 10 to 40 parts by weight of a metal phosphinate flame retardant, wherein the metal is selected from Group IIIA elements.

In one embodiment, the component (A) epoxy resin may be selected from a bifunctional epoxy resin, a trifunctional epoxy resin, a tetrafunctional epoxy resin and a multifunctional epoxy resin. Preferably, the epoxy resin is selected from bisphenol A epoxy resin, bisphenol F epoxy resin, bisphenol S epoxy resin, bisphenol E epoxy resin, phenol novolac epoxy resin, bisphenol A novolac epoxy resin, o-cresol novolac epoxy resin, dicyclopentadiene (DCPD) epoxy resin, phosphorus-containing epoxy resin, fluorine-containing epoxy resin, p-xylene epoxy resin, naphthalene epoxy resin, benzopyran epoxy resin, biphenyl novolac epoxy resin, phenol aralkyl novolac epoxy resin, phenol benzaldehyde epoxy resin, 2,6-dimethyl phenol novolac epoxy resin, tribenzyl epoxy resin and a combination thereof.

In one embodiment, the phosphorus-containing epoxy resin may be a DOPO-containing epoxy resin or a DOPO-HQ-containing epoxy resin; said DOPO-containing epoxy resin is selected from DOPO-containing phenol novolac epoxy resin, DOPO-containing o-cresol novolac epoxy resin, DOPO-containing bisphenol A novolac epoxy resin and a combination thereof; said DOPO-HQ-containing epoxy resin is selected from DOPO-HQ-containing phenol novolac epoxy resin, DOPO-HQ-containing o-cresol novolac epoxy resin, DOPO-HQ-containing bisphenol A novolac epoxy resin and a combination thereof.

More preferably, the epoxy resin is selected from o-cresol novolac epoxy resin, 2,6-dimethyl phenol novolac epoxy resin, phenol benzaldehyde epoxy resin and a combination thereof.

In one embodiment, the component (C) co-hardener comprises acid anhydride, cyanate ester, amine curing agent, phenol curing agent, maleimide, ester curing agent or a combination thereof.

In the resin composition, the acid anhydride is a monofunctional acid anhydride or a multi-functional acid anhydride. Said multi-functional acid anhydride is styrene maleic anhydride. In the styrene maleic anhydride resin, the molar ratio of styrene to maleic anhydride is 1:1, 2:1, 3:1, 4:1, 6:1, 8:1 or 12:1. Useful styrene maleic anhydride may be but not limited to styrene maleic anhydride copolymers such as SMA-1000, SMA-2000, SMA-3000, EF-30, EF-40, EF-60 and EF-80 sold by Cray Valley. Additionally, the styrene maleic anhydride resin may also be an esterified styrene maleic anhydride copolymer, such as esterified styrene maleic anhydride copolymers SMA1440, SMA17352, SMA2625, SMA3840 and SMA31890 sold by Cray Valley. The styrene maleic anhydride resin can be added individually or as a combination to the resin composition of this disclosure.

In said resin composition, cyanate ester is a compound with —O—C≡N or Ar—O—C≡N structure, wherein Ar represents substituted or non-substituted benzene, biphenyl, naphthalene, novolac, bisphenol A, bisphenol A novolac, bisphenol F, bisphenol F novolac or phenolphthalein. Furthermore, Ar can be further bonded to a substituted or non-substituted dicyclopentadienyl (DCPD) group.

In said resin composition, amine curing agent comprises any one or more of dicyandiamide, diamino diphenyl sulfone, diamino diphenyl ether, diamino diphenyl methane and diamino diphenyl sulfide.

In said resin composition, phenol curing agent comprises polyphenylene ether resin, DCPD-phenol resin, phenol novolac resin, and/or biphenyl phenol novolac resin. Preferably, it is polyphenylene ether resin, more preferably being at least one selected from the following resins: monofunctional polyphenylene ether resin (e.g. SA-120 available from SABIC), bifunctional polyphenylene ether resin (e.g. SA-90 available from SABIC), methacrylate polyphenylene ether resin (e.g. SA-9000 available from SABIC) and vinylbenzyl polyphenylene ether resin (e.g. OPE-2st available from Mitsubishi Gas Chemical Co., Inc.).

In said resin composition, ester curing agent comprises polyacrylate or aromatic ester. Examples comprise but are not limited to HPC-8000-T65 available from DIC Co., Ltd. and SR-349 and SR-833S available from Sartomer.

In said resin composition, maleimide comprises at least one of the following resins: 4,4'-diphenylmethane bismaleimide, phenylmethane maleimide or its oligomer, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide and 1,6-bismaleimide-(2,2,4-trimethyl)hexane.

Other Suitable Components

A second flame retardant can be included in the resin composition in addition to the component (D) for use in conjunction therewith, the second flame retardant comprising but not limited to a compound with flame retardant element(s) or flame retardant functional group(s), such as a phosphorous-containing compound, a nitrogen-containing compound or a bromine-containing compound. Said phosphorous-containing compound may be at least one of the following compounds, but not limited thereto: bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri(chloroisopropyl)phosphate, trimethyl phosphate (TMP), dimethyl methyl phosphonate (DMMP), resorcinol bis(dixylenyl phosphate) (RDXP, such as PX-200, commercially available from Daihachi Chemical Industry Co. Ltd.), 4,4'-biphenyl bis(phosphodiesterase-(2,6-dimethylphenyl)ester) (such as PX-202, commercially available from Daihachi Chemical Industry Co. Ltd.), phosphazene (such as SPB-100, commercially available from Otsuka Chemical Co. Ltd.), m-phenylene methylphosphonate (PMP), melamine polyphosphate, 9,10-dihydro-9-oxa-10-phosphaphenanthrene-10-oxide (DOPO), DOPO-containing epoxy resin, DOPO-HQ-containing epoxy resin, diphenyl phosphine oxide (DPPO) compound, diphenylphosphine oxide derivatives, DOPO-containing phenolic resin, e.g. DOPO-HQ, DOPO-containing phenolic novolac (DOPO-PN), and DOPO-containing bisphenol novolac (DOPO-BPN), wherein DOPO-BPN resin may be bisphenol novolac resin such as DOPO-containing bisphenol A novolac (DOPO-BPAN) resin, DOPO-containing bisphenol F novolac (DOPO-BPFN) resin, and DOPO-containing bisphenol S novolac (DOPO-BPSN) resin, etc. The nitrogen-containing compound may be selected from amino triazine novolac (ATN), melamine cyanurate, trihydroxyethyl isocyanurate or a combination thereof. The bromine-containing compound may be selected from, but not limited to, tetrabromobisphenol A (TBBPA), tetrabromocyclohexane, hexabromocyclodecane, 2,4,6-tris(tribromophenoxy)-1,3,5-triazine and decabromodiphenyl ethane (DBDPE).

Preferably, the second flame retardant is used in an amount of 0 to 600% of component (D).

The resin composition may further comprise at least one of the following additives: a curing accelerator, a solvent, a crosslinking agent, a coupling agent, a surfactant, a toughening agent and an inorganic filler.

The resin composition may be further added with inorganic filler. The purpose of adding inorganic filler is to increase the thermal conductivity of the resin composition, improve its thermal expansion, mechanical strength and other properties, and the inorganic filler is preferably evenly distributed in the resin composition.

The inorganic filler may comprise at least one of silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, diamond-like carbon powder, graphite, magnesium carbonate, potassium titanate, ceramic fiber, mica, boehmite, zinc molybdate, ammonium molybdate, zinc borate, calcium phosphate, calcinated talc, talc, silicon nitride, mullite, calcinated kaolin, clay, basic magnesium sulfate whisker, mullite whisker, barium sulfate, magnesium hydroxide whisker, magnesium oxide whisker, calcium oxide whisker, carbon nanotube, nano-scale silica and associated inorganic powder, and powder particles having an organic core and a shell modified by an insulator. Moreover, the inorganic filler can be spherical, fibrous, plate-like, particulate, sheet-like or whisker-like in shape and can be optionally pretreated by a silane coupling agent.

10 to 200 parts by weight of inorganic filler is preferably added, which is preferably spherical nano-scale silica or poly(tetrafluoroethene) powder (PTFE powder).

The purpose of adding curing accelerator is to increase the reaction rate of the resin composition. The purpose of adding surfactant is to ensure uniform distribution of the inorganic filler in the resin composition and to avoid aggregation of the inorganic filler. The purpose of adding toughener is to improve the toughness of the resin composition. The purpose of adding solvent is to change the solid content of the resin composition and to adjust the viscosity of the resin composition. Additives with one or more of the aforesaid effects used in this field can be used by the present disclosure.

Preferably, the use amounts of the curing accelerator, coupling agent, toughener and solvent are 0.01 to 5 parts by weight, 0.001 to 0.1 part by weight, 5 to 50 parts by weight, and 50 to 300 parts by weight, respectively.

The resin composition can be optionally added with one or more curing accelerators to increase the curing rate. Any curing accelerator capable of increasing the curing rate of the resin composition of this disclosure is useful.

The resin composition may comprise a catalyst, such as a Lewis base or a Lewis acid. The Lewis base includes imidazole, boron trifluoride amine complex, ethyltriphenyl phosphonium chloride, 2-methylimidazole, 2-phenylimidazole, 2-ethyl-4-methylimidazole, triphenylphosphine, and/or 4-dimethylaminopyridine. The Lewis acid comprises a metal salt compound, such as a manganese, iron, cobalt, nickel, copper, or zinc metal salt compound, preferably a metal catalyst such as zinc octanoate or cobalt octanoate.

The coupling agent may be silane and/or siloxane compound.

Preferably, the coupling agent is at least one of an amino silane compound, an amino siloxane compound, a styrene-based silane compound, a styrene-based siloxane compound, an acrylic silane compound, an acrylic siloxane compound, a methacrylic silane compound, a methacrylic siloxane compound, an alkyl silane compound and an alkyl siloxane compound.

The toughener may be rubber resin, carboxyl-terminated polybutadiene acrylonitrile, and/or core-shell polymer.

The solvent may comprise at least one selected from the group consisting of methanol, ethanol, ethylene glycol methyl ether, acetone, methyl ethyl ketone, methyl isobutyl ketone, cyclohexanone, toluene, xylene, methoxyethyl acetate, ethoxyethyl acetate, propoxyethyl acetate, ethyl acetate, dimethylformamide, propylene glycol methyl ether, gamma-butyrolactone (GBL) and diisobutyl ketone (DIBK).

Article of Manufacture

This disclosure provides a prepreg obtained by curing the aforesaid resin composition.

In one embodiment, the prepreg may comprise a reinforcement material and the aforementioned resin composition, wherein the reinforcement material is impregnated with the resin composition and becomes semi-cured (B-Staged) under high temperature heating. The reinforcement material may be fibrous material, woven fabric and non-woven fabric, such as fiberglass cloth, which can increase the mechanical strength of the prepreg. In addition, the reinforcement material can be optionally pre-treated by silane coupling agent.

This disclosure provides a resin film comprising said resin composition and a substrate.

In one embodiment, the resin film comprises the aforesaid resin composition. The substrate comprises polyester film (PET film) or polyimide film (PI film) or copper foil. The resin film may be coated on a copper foil, followed by heating and baking to the B-stage to form a resin coated copper (RCC).

This disclosure provides a laminate made from said resin composition.

In one embodiment, the laminate, such as a copper clad laminate, comprises two or more metal foils and at least one insulation layer. The metal foil may be for example a copper foil and may further contain at least one metal alloy such as aluminum, nickel, platinum, silver, gold, etc.; the insulation layer is made by curing the aforesaid prepreg or resin film at high temperature and high pressure, such as by placing the aforesaid prepreg between two metal foils and performing lamination at high temperature and high pressure.

This disclosure provides a printed circuit board which comprises said laminate.

In one embodiment, the printed circuit board comprises at least one aforesaid laminate. The printed circuit board may be made according to conventional process.

Use and Process

Disclosed is a use of said resin composition in preparing high density interconnect multilayer laminates.

Unless otherwise specified, the starting materials of the present disclosure may be commercially available or prepared by conventional methods known in the art. Unless otherwise defined or specified, all technical and scientific terms used herein have the meanings known by those skilled in the art. In addition, any process or material similar or equivalent to those cited herein may be used in the disclosure.

The synthesis processes recited above constitute only the synthesis routes of a part of compounds of this disclosure. Based on the examples illustrated, persons skilled in the art can make adjustment to synthesize other compounds of this disclosure, or persons skilled in the art may synthesize the compounds of this disclosure according to the teachings in prior arts.

Due to the disclosure of this invention, other aspects of this invention are readily comprehensible to persons skilled in the art.

The present disclosure will be further illustrated in conjunction with the following embodiments. It will be understood that the embodiments are exemplary only and are not intended to limit the scope of the present disclosure. In the examples and embodiments below, experimental processes without specified conditions are usually carried out according to national standards. If there is not a corresponding national standard, commonly acceptable international standards, routine conditions or conditions proposed by manufacturers are followed. In addition, unless otherwise noted, all parts and percentages are by weight, and the molecular weight of a polymer is the number average molecular weight.

The names of chemicals used in the examples and comparative examples are as follows:
1. Biphenyl epoxy resin: NC-3000, available from Nippon Kayaku.
2. Dicyclopentadiene phenol epoxy resin: HP-7200H, available from D.I.C.
3. Phenol benzaldehyde epoxy resin: NPPN-433, available from Nan Ya Plastics Corporation.
4. Diamino diphenyl ether benzoxazine resin: PF-3500, available from Chang Chun Plastics. Co. Ltd.
5. Bisphenol A type benzoxazine resin: LZ 8290, available from Huntsman Corporation.
6. Bisphenol F type benzoxazine resin: LZ 8280, available from Huntsman Corporation.
7. Phenolphthalein type benzoxazine resin: MT 35800, available from Huntsman Corporation.
8. Diamino diphenyl sulfone, available from Atul LTD.
9. Phenylmethane maleimide: BMI-2300, available from Daiwakasei Industry Co. Ltd.
10. Hydroxyl-terminated polyphenylene ether resin: SA-90, available from SABIC.
11. Styrene-maleic anhydride: C400, available from Polyscope.
12. Di-DOPO high melting point phosphorus-containing flame retardant (Di-DOPO):

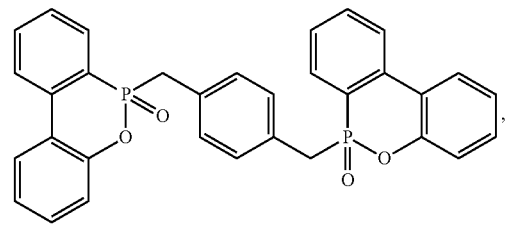 [SMILES: O=P1(Cc2ccc(CP3(=O)Oc4ccccc4-c4ccccc43)cc2)Oc2ccccc2-c2ccccc21]

melting point 270° C. to 280° C.
13. Di-DPPO high melting point phosphorus-containing flame retardant (Di-DPPO): Diphenylphosphine oxide, disclosed in China Patent Publication No. CN105440645(A).
14. Aluminum phosphinate flame retardant: OP-930, available from Clariant.
15. Condensed phosphate ester (low melting point phosphorus-containing flame retardant): PX-200, available from Daihachi Chemical Industry Co. Ltd.

16. Phosphazene (low melting point phosphorus-containing flame retardant): SPB-100, available from Otsuka Chemical Co., Ltd.
17. 4,4'-biphenyl bis(phosphodiesterase-(2,6-dimethylphenyl)ester) (low melting point phosphorus-containing flame retardant): PX-202, available from Daihachi Chemical Industry Co. Ltd.
18. Silica: L10, available from Chongqing Jinyi Silicon Materials Development Co., Ltd.
19. 2-Ethyl-4-methylimidazole: 2E4MI, available from Shikoku Chemicals Corporation.
20. Ester curing agent: HPC-8000-65T, available from D.I.C.
21. Cyanate ester:BA-230S, available from Lonza.

EXAMPLES

1. Resin Compositions Shown in the Tables were Used to Prepare Prepregs.

Resin compositions of E1 to E22 and C1 to C6 listed in the tables were well mixed in a stirred tank separately and then placed in an impregnation tank separately, and glass fiber fabrics (2116, 1067 or 1078 E-glass fiber fabrics, available from Nan Ya Plastics Corp.) were individually passed through the impregnation tank to impregnate the glass fiber fabrics with the resin compositions, followed by heating and baking at 150° C. to a semi-cured state to obtain prepregs.

2. Copper-Free Laminates were Prepared as Follows.

(1) Copper-Free Laminate (4-Ply)

Two sheets of copper foil with a 18 μm thickness and the prepregs obtained above (four prepregs from each example and comparative example, each using 2116 E-glass fiber fabric and having a resin content of about 55%) were prepared. A copper foil, four prepregs and a copper foil were laminated in order, and a copper-clad laminate (4-ply) was formed by lamination in vacuum at 210° C. for two hours, wherein the insulating layers were formed by laminating four sheets of prepreg between the two copper foils, and the resin content of the insulating layers is about 55%.

Then each copper-clad laminate obtained above was etched for removing the two copper foils so as to obtain the copper-free laminate (4-ply). Each copper-free laminate (4-ply) was formed by laminating four prepregs, and the resin content thereof was about 55%.

(2) Copper-Free Laminate (2-Ply)

Two sheets of copper foil with a 18 μm thickness and the prepregs obtained above (two prepregs from each example and comparative example, each using 2116 E-glass fiber fabric) were prepared; a copper foil, two prepregs and a copper foil were laminated in order, and a copper-clad laminate (2-ply) was formed by lamination in vacuum at 210° C. for two hours.

Then each copper-clad laminate obtained above was etched for removing the two copper foils so as to obtain the copper-free laminate (2-ply). Each insulated laminate (2-ply) was formed by laminating two prepregs, and the resin content thereof was about 55%.

(3) Copper-Free Laminate (8-Ply)

Two 0.5 oz high temperature elongation (HTE) copper foils and eight prepregs (using 2116 E-glass fiber fabric) obtained from each resin composition were prepared. The resin content of each prepreg was about 48%. The eight prepregs were superimposed and sandwiched between the two copper foils and subject to a lamination process in vacuum at 195° C. for 2 hours to form a copper clad laminate (CCL). Then each copper clad laminate obtained above was etched for removing the two copper foils so as to obtain the copper-free laminate (8-ply). Each copper-free laminate (8-ply) was formed by laminating eight prepregs, and the thickness of insulation layers of the copper-free laminate was 0.82 mm.

3. Preparation of Horizontal Black Oxide-Processed Laminate (Containing Copper Foil)

A core laminate was prepared as follows: preparing four first prepregs (e.g. EM-827 available from Elite Material Co., Ltd., using 7629 glass fiber fabric, RC=42%); at two sides of the four superimposed first prepregs, separately covering a 0.5 oz (ounce) HTE (high temperature elongation) copper foil, followed by laminating and curing for 2 hours in vacuum at high temperature (195° C.) and high pressure (360 psi) to obtain a copper-containing core laminate with a thickness of 20 mil. Subjecting the core laminate to a horizontal black oxide trace process to obtain a black oxide-processed core laminate; separately placing a prepreg on both sides of the black oxide-processed core laminate, wherein the two prepregs are made from the resin composition of the same example or same comparative example (using 2116 E-glass fiber fabric and having a resin content of about 55%); separately covering a 0.5 oz HTE copper foil on the outer side of the two prepregs, and superimposing the copper foil, prepreg, black oxide-processed core laminate, prepreg and copper foil in said order, followed by laminating for 2 hours in vacuum at 195° C. to obtain a copper-containing black oxide-processed laminate.

Property Tests

Each property was measured as follows:

(1) Glass Transition Temperature (Tg)

The aforementioned copper-free laminate (4-ply) was used as a specimen for glass transition temperature measurement. A thermomechanical analyzer (TMA) was used for measurement in accordance with IPC-TM-650 2.4.24.5.

(2) Post-Reflow Laminate Shrinkage (Reflow Resin Shrinkage)

In dimensional stability testing, two prepregs (2116 glass fiber fabric) were chosen and covered on two sides with a 0.5 oz (ounce) HTE copper foils separately, followed by being laminated in an order of copper foil, prepreg, prepreg, and copper foil in vacuum at 210° C. for 2 hours to form a copper clad laminate with a thickness of 10 mil used as the specimen. Using a three-dimensional measuring instrument by reference to the process of IPC-TM-650 2.4.39 (Dimensional Stability, Glass Reinforced Thin Laminates) to test the specimen, wherein the copper-free laminate before reflow was tested first (pre-reflow), and then the copper-free laminate was subject to one 260° C. reflow cycle and tested again (post-reflow). In the test results, the difference between the method employed by the present disclosure and IPC-TM-650 2.4.39 is that the present disclosure measured the dimensional change of a laminate before and after reflow. Lower reflow shrinkage represents better laminate property.

In particular, reflow shrinkage represents the dimensional change of a copper-free laminate subject to one reflow cycle and has a unit of %. Reflow shrinkage may be calculated by the following equation: reflow shrinkage=((dimension of copper-free laminate after reflow dimension of copper-free laminate before reflow)/dimension of copper-free laminate before reflow)*100%.

(3) Storage Modulus

A DMA instrument was used to measure the storage modulus of a copper-free laminate (8-ply) by reference to the process of IPC-TM-650 2.4.24.4 (Glass Transition and Modulus of Materials Used in High Density Interconnection (HDI) and Micro vias-DMA Method), wherein the storage modulus at 50° C. and 250° C. was measured separately, with a unit of Gpa.

(4) Modulus Decrease Rate

Modulus decrease rate may be calculated by the following equation: modulus decrease rate=((modulus at 50° C.−modulus at 250° C.)/modulus at 50° C.)*100%.

(5) High Density Hole Thermal Resistance

A double-sided board was made as follows: preparing 7 prepregs (using 2116 E-glass fiber fabric) and covering on each outer side with a 0.5 oz HTE copper foil; in the order of copper foil, prepregs and copper foil, performing lamination and curing for 2 hours in vacuum at high temperature (195° C.) and high pressure (360 psi) to obtain a copper clad laminate, which is then subject to PCB processing, such as drilling, adhesive residue removal, electroplating, etc., to obtain a double-sided board (pitch: 0.7 mm, 0.8 mm, 1.0 mm). After 6 reflow cycles, evaluating the double-sided board by observing the presence of delamination.

(6) PCT Thermal Resistance after Horizontal Black Oxide Process

A horizontal black oxide-processed copper-free laminate was placed at 121° C. for moisture absorption for 3 hours and then removed and immersed into a 288° C. solder bath for 20 seconds, followed by visual inspection for delamination after removal from the solder bath. PCT (pressure cooker test) of each specimen was carried out by reference to the process of IPC-TM-650 2.6.16.1.

(7) Warpage Height

The resin composition of each example and comparative example was used to prepare a core laminate as follows: preparing a prepreg from the resin composition as the first prepreg (using 1078 E-glass fiber fabric and having a resin content of about 55%); placing a 0.5 oz HTE copper foil on each side of the first prepreg and performing lamination and curing in vacuum at high temperature (195° C.) and high pressure (360 psi) conditions for 2 hours to obtain a copper-containing laminate, followed by trace fabrication processes on the copper foil surface, including conventional processes such as exposure, lithography, etching, etc., to obtain a core laminate with a thickness of about 2.4 mil (0.06096 mm).

The build-up process is as follows: after obtaining the core laminate, preparing a second prepreg from the resin composition of each example and comparative example (using 1067 glass fiber fabric, RC=67%); placing a second prepreg on each side of the core laminate separately and then covering a 0.5 oz HTE copper foil on the second prepreg at the other side separately, followed by laminating and curing in vacuum at high temperature (195° C.) and high pressure (360 psi) conditions for 2 hours to complete the first lamination, which is followed by a drilling process to make alignment holes and then hole metallization process and trace process to complete the first build-up step to obtain a four-layer board.

Repeating the build-up processes to form a six-layer board (second build-up, second lamination), an eight-layer board (third build-up, third lamination), and finally a ten-layer board (fourth build-up, fourth lamination).

A ten-layer board with a size of 150 mm*78 mm was subjected to a reflow process by using a TherMoire apparatus sold by Akrometrix by reference to the published Full-field Signed Warpage method, during which the temperature was raised from 30° C. to 260° C. such that the average warpage difference of the ten-layer board measured between the temperatures was calculated as the warpage height (unit: μm).

Results

Comparison between E4 and C1 to C6 shows that diamino diphenyl ether type benzoxazine used with the co-hardener and high melting point flame retardant may obtain a laminate with excellent horizontal black oxide thermal resistance and high density hole thermal resistance, reduced warpage and reflow shrinkage, lower modulus decrease rate and increased storage modulus.

Observations of E11 to E21 show that when 100 parts by weight of epoxy resin is used in conjunction with 10 to 60 parts by weight of diamino diphenyl ether type benzoxazine, 10 to 40 parts by weight of co-hardener and 10 to 40 parts by weight of high melting point flame retardant, properties of the laminate, including horizontal black oxide thermal resistance, high density hole thermal resistance, reflow shrinkage, warpage and modulus decrease rate, can be well balanced.

TABLE 1

| component | | | E1 | E2 | E3 | E4 | E5 | E6 | E7 | E8 |
|---|---|---|---|---|---|---|---|---|---|---|
| epoxy resin | biphenyl epoxy resin | NC-3000 | 100 | | | 30 | 30 | 30 | 30 | 30 |
| | dicyclopentadiene phenol epoxy resin | HP-7200H | | 100 | | 40 | 40 | 40 | 40 | 40 |
| | phenol benzaldehyde epoxy resin | NPPN-433 | | | 100 | 30 | 30 | 30 | 30 | 30 |
| benzoxazine resin | diamino diphenyl ether benzoxazine resin | PF-3500 | 30 | 30 | 30 | 30 | 30 | 30 | 30 | 30 |
| | bisphenol A type benzoxazine resin | LZ 8290 | | | | | | | | |
| | bisphenol F type benzoxazine resin | LZ 8280 | | | | | | | | |
| | phenolphthalein type benzoxazine resin | MT 35800 | | | | | | | | |
| co-hardener | DDS | DDS | | | | | | | | 5 |
| | BMI | BMI-2300 | 25 | 25 | 25 | 25 | 25 | 25 | | |
| | PPO | SA-90 | | | | | | | 10 | |
| | SMA | C400 | | | | | | | | |
| flame retardant | high melting point phosphorus-containing flame retardant | Di-DOPO | 25 | 25 | 25 | 25 | | | 25 | 25 |
| | high melting point phosphorus-containing flame retardant | Di-DPPO | | | | | 25 | | | |
| | high melting point phosphorus-containing | OP-930 | | | | | | 25 | | |

TABLE 1-continued

| | | | E1 | E2 | E3 | E4 | E5 | E6 | E7 | E8 |
|---|---|---|---|---|---|---|---|---|---|---|
| | flame retardant (aluminum phosphinate) | | | | | | | | | |
| | low melting point phosphorus-containing flame retardant | PX-200 | | | | | | | | |
| | low melting point phosphorus-containing flame retardant | SPB-100 | | | | | | | | |
| | low melting point phosphorus-containing flame retardant | PX-202 | | | | | | | | |
| inorganic filler | silica | L10 | 50 | 50 | 50 | 50 | 50 | 50 | 50 | 50 |
| catalyst | 2-ethyl-4-methylimidazole | 2E4MI | 0.3 | 0.3 | 0.3 | 0.3 | 0.3 | 0.3 | 0.3 | 0.3 |
| solvent | methyl ethyl ketone | MEK | 60 | 60 | 60 | 60 | 60 | 60 | 60 | 60 |

| laminate property | test item | unit | E1 | E2 | E3 | E4 | E5 | E6 | E7 | E8 |
|---|---|---|---|---|---|---|---|---|---|---|
| glass transition temperature | TMA | °C. | 185 | 177 | 180 | 180 | 181 | 176 | 178 | 183 |
| reflow resin shrinkage | three-dimensional | ppm | 102 | 130 | 118 | 105 | 111 | 146 | 120 | 114 |
| storage modulus (50° C.) | DMA | GPa | 19.30 | 18.33 | 18.64 | 18.88 | 19.20 | 18.80 | 18.10 | 18.61 |
| storage modulus (250° C.) | DMA | GPa | 6.55 | 5.63 | 6.11 | 6.23 | 6.33 | 5.88 | 5.95 | 6.04 |
| modulus decrease rate (Δ50~250) | / | % | 66 | 69 | 67 | 67 | 67 | 69 | 67 | 68 |
| high density hole thermal resistance | number of delamination laminate after reflow at 260° C. (N = 6) Pitch = 0.7 mm | cycle | >6 | >6 | >6 | >6 | >6 | >6 | >6 | >6 |
| PCT thermal resistance after horizontal black oxide process | 2 atm, 1 h | N/A | pass | pass | pass | pass | pass | pass | pass | pass |
| warpage height | / | μm | −475 | −533 | −487 | −455 | −422 | −683 | −554 | −436 |

TABLE 2

| | component | | E9 | E10 | E11 | C1 | C2 | C3 | C4 | C5 | C6 |
|---|---|---|---|---|---|---|---|---|---|---|---|
| epoxy resin | biphenyl epoxy resin | NC-3000 | 30 | 30 | 30 | 30 | 30 | 30 | 30 | 30 | 30 |
| | dicyclopentadiene phenol epoxy resin | HP-7200H | 40 | 40 | 40 | 40 | 40 | 40 | 40 | 40 | 40 |
| | phenol benzaldehyde epoxy resin | NPPN-433 | 30 | 30 | 30 | 30 | 30 | 30 | 30 | 30 | 30 |
| benzoxazine resin | diamino diphenyl ether benzoxazine resin | PF-3500 | 30 | 30 | 30 | 30 | 30 | 30 | | | |
| | bisphenol A type benzoxazine resin | LZ 8290 | | | | | | | 30 | | |
| | bisphenol F type benzoxazine resin | LZ 8280 | | | | | | | | 30 | |
| | phenolphthalein type benzoxazine resin | MT 35800 | | | | | | | | | 30 |
| co-hardener | DDS | DDS | | 3 | | | | | | | |
| | BMI | BMT-2300 | | 10 | 10 | 25 | 25 | 25 | 25 | 25 | 25 |
| | PPO | SA-90 | | 5 | | | | | | | |
| | SMA | C400 | 15 | 10 | | | | | | | |
| | cyanate ester | BTP-6020S | | | 5 | | | | | | |
| | ester curing agent | HPC-8000-65T | | | 15 | | | | | | |
| flame retardant | high melting point phosphorus-containing flame retardant | Di-DOPO | 25 | 10 | 25 | | | 25 | 25 | 25 | 25 |
| | high melting point phosphorus-containing flame retardant | Di-DPPO | | 10 | | | | | | | |
| | high melting point phosphorus-containing flame retardant | DE-60H | | 5 | | | | | | | |
| | high melting point phosphorus-containing flame retardant (aluminum phosphinate) | OP-930 | | | | | | | | | |
| | low melting point phosphorus-containing flame retardant | PX-200 | | | | 25 | | | | | |
| | low melting point phosphorus-containing flame retardant | SPB-100 | | | | | 25 | | | | |

TABLE 2-continued

| | | | | | | | | | | | |
|---|---|---|---|---|---|---|---|---|---|---|---|
| | low melting point phosphorus-containing flame retardant | PX-202 | | | | | | | 25 | | |
| inorganic filler | silica | L10 | 50 | 50 | 50 | 50 | 50 | 50 | 50 | 50 | 50 |
| catalyst | 2-ethyl-4-methylimidazole | 2E4M1 | 0.3 | 0.3 | 0.3 | 0.3 | 0.3 | 0.3 | 0.3 | 0.3 | 0.3 |
| solvent | methyl ethyl ketone | MEK | 60 | 60 | 60 | 60 | 60 | 60 | 60 | 60 | 60 |
| laminate property | test item | unit | E9 | E10 | E11 | C1 | C2 | C3 | C4 | C5 | C6 |
| glass transition temperature | TMA | °C. | 177 | 180 | 178 | 155 | 161 | 152 | 174 | 169 | 175 |
| reflow resin shrinkage | three-dimensional | ppm | 133 | 100 | 122 | 305 | 282 | 328 | 144 | 160 | 118 |
| storage modulus (50° C.) | DMA | GPa | 17.98 | 18.55 | 18.66 | 16.20 | 16.81 | 16.00 | 17.32 | 17.82 | 18.64 |
| storage modulus (250° C.) | DMA | GPa | 5.69 | 6.84 | 6.56 | 3.35 | 3.32 | 3.12 | 4.65 | 4.51 | 4.83 |
| modulus decrease rate (Δ50~250) | / | % | 68 | 63 | 65 | 79 | 80 | 81 | 73 | 75 | 74 |
| high density hole thermal resistance | number of delamination laminate after reflow at 260° C. (N = 6) Pitch = 0.7 mm | cycle | >6 | >6 | >6 | 3 | 3 | 2 | 3 | 2 | 4 |
| PCT thermal resistance after horizontal black oxide process | 2 atm, 1 h | N/A | pass | pass | pass | pass | pass | pass | fail | fail | fail |
| warpage height | / | μm | −537 | −430 | −455 | −1780 | −1645 | −1687 | −1020 | −1265 | −1123 |

TABLE 3

| | component | | E4 | E12 | E13 | C7 | C8 | E16 | E17 |
|---|---|---|---|---|---|---|---|---|---|
| epoxy resin | biphenyl epoxy resin | NC-3000 | 30 | 30 | 30 | 30 | 30 | 30 | 30 |
| | dicyclopentadiene phenol epoxy resin | HP-7200H | 40 | 40 | 40 | 40 | 40 | 40 | 40 |
| | phenol benzaldehyde epoxy resin | NPPN-433 | 30 | 30 | 30 | 30 | 30 | 30 | 30 |
| benzoxazine resin | diamino diphenyl ether benzoxazine resin | PF-3500 | 30 | 10 | 60 | 5 | 70 | 30 | 30 |
| co-hardener | BMI | | 25 | 25 | 25 | 25 | 25 | 25 | 25 |
| flame retardant | high melting point phosphorus-containing flame retardant | Di-DOPO | 25 | 25 | 25 | 25 | 25 | 10 | 40 |
| inorganic filler | silica | L10 | 50 | 50 | 50 | 50 | 50 | 50 | 50 |
| catalyst | 2-ethyl-4-methyl imidazole | 2E4M1 | 0.3 | 0.3 | 0.3 | 0.3 | 0.3 | 0.3 | 0.3 |
| solvent | methyl ethyl ketone | MEK | 60 | 60 | 60 | 60 | 60 | 60 | 60 |

| | component | | C9 | C10 | E20 | E21 | C11 | C12 |
|---|---|---|---|---|---|---|---|---|
| epoxy resin | biphenyl epoxy resin | NC-3000 | 30 | 30 | 30 | 30 | 30 | 30 |
| | dicyclopentadiene phenol epoxy resin | HP-7200H | 40 | 40 | 40 | 40 | 40 | 40 |
| | phenol benzaldehyde epoxy resin | NPPN-433 | 30 | 30 | 30 | 30 | 30 | 30 |
| benzoxazine resin | diamino diphenyl ether benzoxazine resin | PF-3500 | 30 | 30 | 30 | 30 | 30 | 30 |
| co-hardener | BMI | | 25 | 25 | 10 | 40 | 5 | 50 |
| flame retardant | high melting point phosphorus-containing flame retardant | Di-DOPO | 3 | 50 | 25 | 25 | 25 | 25 |
| inorganic filler | silica | L10 | 50 | 50 | 50 | 50 | 50 | 50 |
| catalyst | 2-ethyl-4-methyl imidazole | 2E4M1 | 0.3 | 0.3 | 0.3 | 0.3 | 0.3 | 0.3 |
| solvent | methyl ethyl ketone | MEK | 60 | 60 | 60 | 60 | 60 | 60 |

| laminate property | test item | unit | E4 | E12 | E13 | C7 | C8 | E16 | E17 |
|---|---|---|---|---|---|---|---|---|---|
| glass transition temperature | TMA | °C. | 180 | 178 | 182 | 177 | 180 | 176 | 182 |
| reflow resin shrinkage | three-dimensional | ppm | 105 | 112 | 122 | 145 | 133 | 143 | 93 |
| storage modulus (50° C.) | DMA | GPa | 18.88 | 18.74 | 18.51 | 18.13 | 19.22 | 18.41 | 19.22 |
| storage modulus (250° C.) | DMA | GPa | 6.23 | 6.25 | 6.31 | 6.23 | 6.54 | 6.13 | 6.55 |

TABLE 3-continued

| laminate property | test item | unit | | | | | | | |
|---|---|---|---|---|---|---|---|---|---|
| modulus decrease rate (Δ50~250) | / | % | 67 | 67 | 66 | 66 | 66 | 67 | 66 |
| high density hole thermal resistance | number of delamination laminate after reflow at 260° C. (N = 6) pitch = 0.7 mm | cycle | >6 | >6 | >6 | >6 | 3 | >6 | >6 |
| PCT thermal resistance after horizontal black oxide process | 2 atm, 1 h | N/A | pass | pass | pass | pass | pass | pass | pass |
| warpage height | / | μm | -455 | -675 | -612 | -1322 | -544 | -453 | -483 |

| laminate property | test item | unit | C9 | C10 | E20 | E21 | C11 | C12 |
|---|---|---|---|---|---|---|---|---|
| glass transition temperature | TMA | ° C. | 175 | 177 | 179 | 184 | 176 | 184 |
| reflow resin shrinkage | three-dimensional | ppm | 250 | 90 | 102 | 106 | 106 | 113 |
| storage modulus (50° C.) | DMA | GPa | 16.51 | 17.21 | 18.4 | 19.32 | 16.43 | 18.52 |
| storage modulus (250° C.) | DMA | GPa | 3.25 | 3.15 | 6.25 | 6.45 | 3.23 | 5.12 |
| modulus decrease rate (Δ50~250) | / | % | 80 | 82 | 66 | 67 | 80 | 72 |
| high density hole thermal resistance | number of delamination laminate after reflow at 260° C. (N = 6) pitch = 0.7 mm | cycle | >6 | >6 | >6 | >6 | >6 | >6 |
| PCT thermal resistance after horizontal black oxide process | 2 atm, 1 h | N/A | pass | pass | pass | pass | pass | fail |
| warpage height | / | μm | -425 | -464 | -495 | -525 | -575 | -1344 |

CONCLUSION

From Tables 1 to 3, it is observed from the comparative examples that using diamino diphenyl ether type benzoxazine in conjunction with the co-hardener and low melting point flame retardant (e.g. phosphazene, resorcinol bis(dixylenyl phosphate), or 4,4'-biphenyl bis(phosphodiesterase-(2,6-dimethylphenyl)ester) will worsen the laminate Tg, reduce high density hole thermal resistance, and cause warpage easily; in addition, the reflow shrinkage and modulus decrease rate are increased.

Furthermore, non-diamino diphenyl ether type benzoxazine used in conjunction with the co-hardener and high melting point flame retardant will result in a laminate with poor horizontal black oxide thermal resistance, poor high density hole thermal resistance and inclination to warpage.

Comparisons between examples and comparative examples show that diamino diphenyl ether type benzoxazine used in conjunction with the co-hardener and a specific flame retardant demonstrates an unexpected synergistic effect.

The above detailed description is merely illustrative of the preferred embodiments of this invention and is not intended to limit the scope of this invention, which is broadly defined by the claims set forth below. Technical solutions, implementations or processes accomplished by others will be considered to fall within the scope of the claims if they are completely identical to those defined in the appended claims or are equivalent modifications of this invention.

All references cited in this invention are incorporated by reference in their entirety, as if they were referenced individually. In addition, it is understood that after reading this specification, skilled artisans appreciate that various changes and modifications are possible, but these equivalents shall also fall within the scope of the appended claims.

What is claimed is:

1. A resin composition comprising the following components:
   (A) 100 parts by weight of an epoxy resin comprising biphenyl epoxy resin, dicyclopentadiene phenol epoxy resin, phenol benzaldehyde epoxy resin, phosphorus-containing epoxy resin, naphthalene epoxy resin, o-cresol novolac epoxy resin, 2,6-dimethyl phenol novolac epoxy resin, tetrafunctional epoxy resin, bisphenol A novolac epoxy resin, phenol novolac epoxy resin or a combination thereof;
   (B) 10 to 60 parts by weight of a diamino diphenyl ether type benzoxazine resin having a softening point of 69° C. to 85° C., wherein the diamino diphenyl ether type benzoxazine resin is obtained by polymerization of the following monomer:

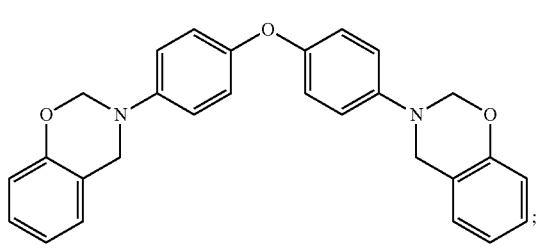 [SMILES: c1ccc2c(c1)CN(c1ccc(Oc3ccc(N4COc5ccccc5C4)cc3)cc1)CO2]

(C) 10 to 40 parts by weight of a co-hardener or 5 parts by weight of diamino diphenyl sulfone; and
   (D) 10 to 40 parts by weight of a flame retardant which comprises the following flame retardant (d1), flame retardant (d2) or a combination thereof:
   (d1) a high melting point flame retardant, selected from a phosphorus-containing flame retardant with a melting point of greater than 260° C. and having at least two DOPO structures, a phosphorus-containing flame retardant with a melting point of greater than 260° C. and having at least two DPPO structures and a combination thereof, or (d2) a metal phosphinate flame retardant, wherein the metal is selected from Group IIIA elements.

2. The resin composition of claim 1, wherein the component (d1) high melting point flame retardant is selected from a phosphorus-containing flame retardant with a melting point of greater than 260° C. and having two DOPO structures, a phosphorus-containing flame retardant with a melting point of greater than 260° C. and having two DPPO structures and a combination thereof.

3. The resin composition of claim 2, wherein the phosphorus-containing flame retardant with a melting point of greater than 260° C. and having two DOPO structures is selected from

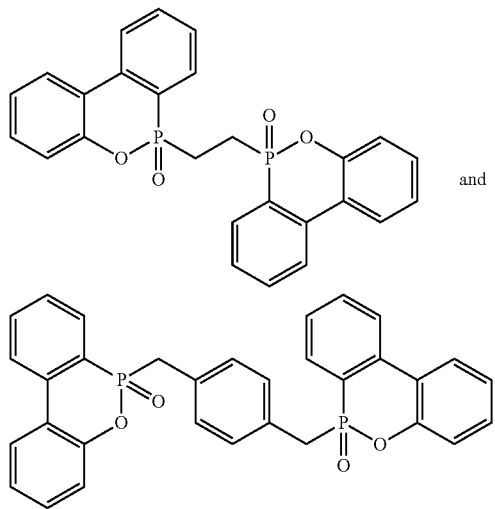

and and wherein the phosphorus-containing flame retardant with a melting point of greater than 260° C. and having two DPPO structures is

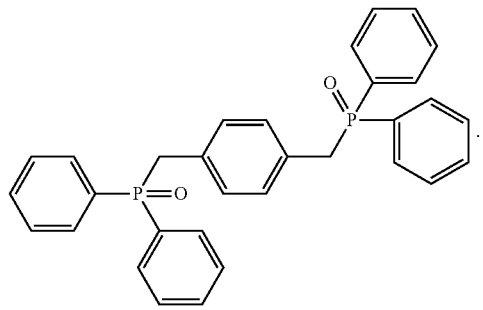 [SMILES: O=P(Cc1ccc(CP(=O)(c2ccccc2)c2ccccc2)cc1)(c1ccccc1)c1ccccc1]

4. The resin composition of claim 1, wherein the component (d1) high melting point flame retardant has a melting point between 265° C. and 350° C.

5. The resin composition of claim 1, wherein the component (d1) high melting point flame retardant has a melting point between 270° C. and 330° C.

6. The resin composition of claim 1, wherein the component (d2) metal phosphinate flame retardant is aluminum phosphinate.

7. The resin composition of claim 1, wherein the component (C) co-hardener comprises acid anhydride, cyanate ester, amine curing agent, phenol curing agent, maleimide, ester curing agent or a combination thereof.

8. An article of manufacture made from the resin composition of claim 1, which comprises a prepreg, a resin film, a laminate or a printed circuit board.

9. A method of using the resin composition of claim 1 in preparing a high density interconnect multilayer laminate.

* * * * *